(12) United States Patent
Parent (10) Patent No.: US 7,876,612 B2
(45) Date of Patent: Jan. 25, 2011

(54) METHOD FOR REDUCING LEAKAGE CURRENT OF A MEMORY AND RELATED DEVICE

(75) Inventor: Richard Michael Parent, Shelburne, VT (US)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 165 days.

(21) Appl. No.: 12/247,235

(22) Filed: Oct. 8, 2008

(65) Prior Publication Data

US 2010/0085828 A1 Apr. 8, 2010

(51) Int. Cl.
*G11C 16/04* (2006.01)

(52) U.S. Cl. .............................. 365/185.02; 365/230.06; 365/226

(58) Field of Classification Search ............ 365/189.09, 365/230.03, 230.06, 230.08, 185.02, 226
See application file for complete search history.

(56) References Cited

U.S. PATENT DOCUMENTS

| 5,784,331 | A * | 7/1998 | Lysinger | 365/230.06 |
| 5,896,344 | A * | 4/1999 | Kirsch et al. | 365/230.06 |
| 6,603,702 | B2 * | 8/2003 | Kojima | 365/230.06 |
| 7,646,653 | B2 * | 1/2010 | Choi et al. | 365/189.09 |
| 2004/0080358 | A1 * | 4/2004 | Kushnarenko | 327/530 |

* cited by examiner

*Primary Examiner*—Pho M. Luu
(74) *Attorney, Agent, or Firm*—Winston Hsu; Scott Margo (57) ABSTRACT

A method for reducing leakage current of a memory device includes supplying a first voltage to a main wordline driver, supplying a second voltage greater than the first voltage to a local wordline driver, and employing a transistor in the local wordline driver with a threshold voltage greater than a specific value.

14 Claims, 7 Drawing Sheets

FIG. 1 PRIOR ART

| Signal voltage level | VBMWL high VWLDV high | VBMWL high VWLDV low | VBMWL low VWLDV high | VBMWL low VWLDV low | Standby |
|---|---|---|---|---|---|
| VBMWL | -0.6 | -0.6 | VPP | VPP | VPP |
| VWLDV | VPP | GND | VPP | GND | GND |
| VLWL | VPP | -0.6 | -0.6 | -0.6 | -0.6 |

| Signal voltage level | VBMWL high VWLDV high | VBMWL high VWLDV low | VBMWL low VWLDV high | VBMWL low VWLDV low | Standby |
|---|---|---|---|---|---|
| VBMWL | -0.6 | -0.6 | VDD1 | VDD1 | VDD1 |
| VWLDV | VPP | GND | VPP | GND | GND |
| VLWL | VPP | -0.6 | -0.6 | -0.6 | -0.6 |

METHOD FOR REDUCING LEAKAGE CURRENT OF A MEMORY AND RELATED DEVICE

BACKGROUND OF THE INVENTION

1. Field of the Invention

The present invention relates to a method capable of reducing DC (direct-current) current operating in the standby mode of a low power dynamic random access memory (DRAM), and more particularly, to a method capable of effectively reducing the DC current induced by gate induced drain leakage (GIDL) effect.

2. Description of the Prior Art

In the recent years, portable devices, like cellular phone, PDA, notebook computers, are getting popular in our everyday life and the power saving requirement has become one of the main design objectives for those electronic products. Numerous efforts have been spent by circuit designers and engineers for reducing the power consumption of the electronic devices.

One of the primary items for low power DRAM design is to reduce DC current in a standby mode to meet the requirements of "Idd6" specifications, proposed by JEDEC, the Joint Electronic Device Engineering Council. The Idd6 specification for standby mode is important because it is closely related to the length of time for the electronic device to stay in the standby mode. If the standby time of the electronic device can be extended, the user convenience can be improved, and the portability of the device can also be advanced.

Figure 1:
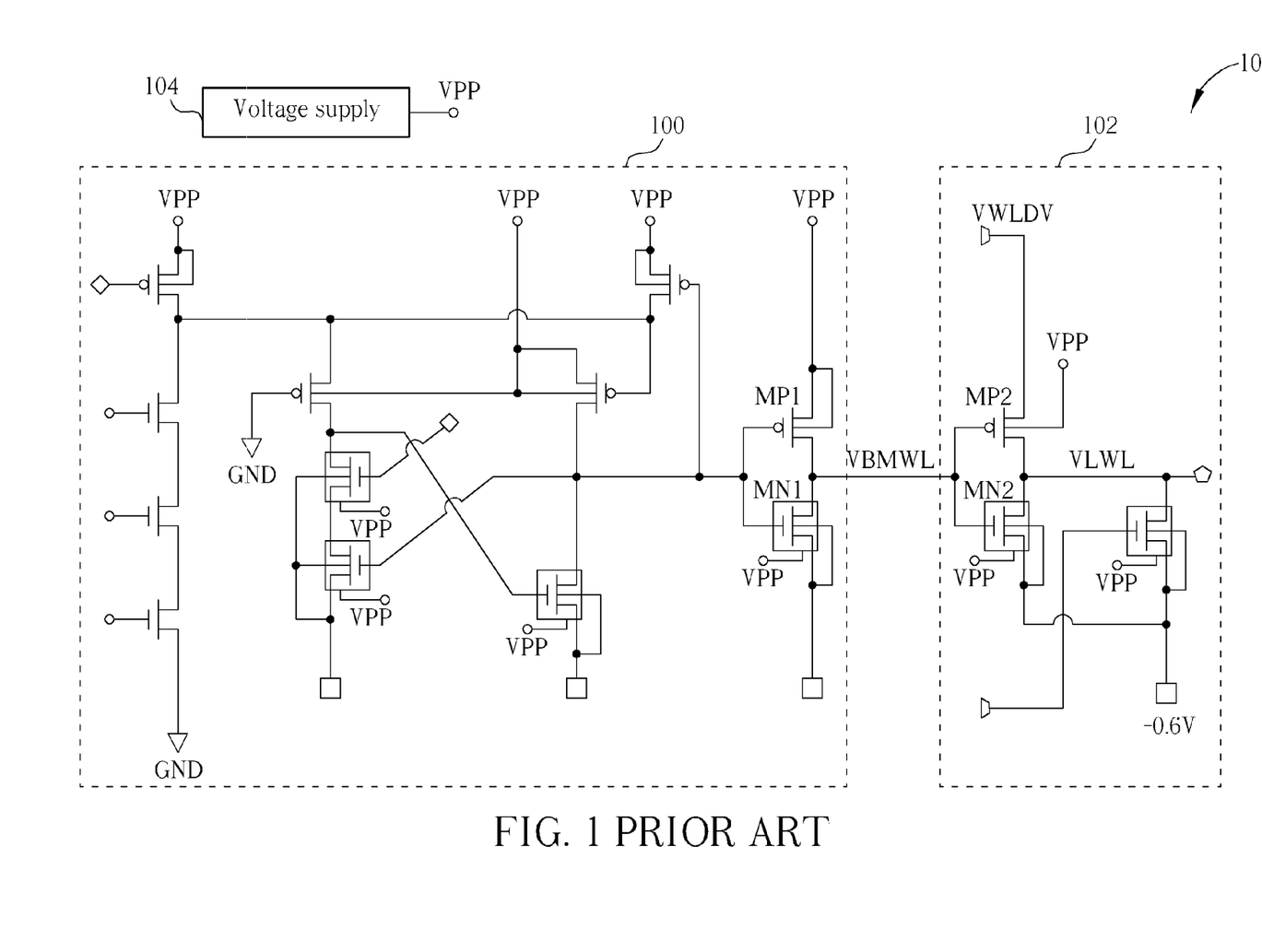
FIG. 1 illustrates a schematic diagram of a wordline driver.

Please refer to FIG. 1, which illustrates a schematic diagram of a wordline driver 10. The wordline driver 10 is a hierarchical wordline architecture, and can be divided into a double layered structure comprising a main wordline driver 100, a local wordline driver 102 and a voltage supply 104. The major function of the voltage supply 104, usually a charge pump circuit, is to provide an output voltage VPP at about 2.6 volt and the one lower than the ground voltage GND at −0.6 volt, which are responsible for both the operations of the main wordline driver 100 and the local wordline driver 102. The charge pump circuit is a very useful circuit but is also known for poor power efficiency, and it could magnify an internal leakage current to a larger external current.

Figure 2:
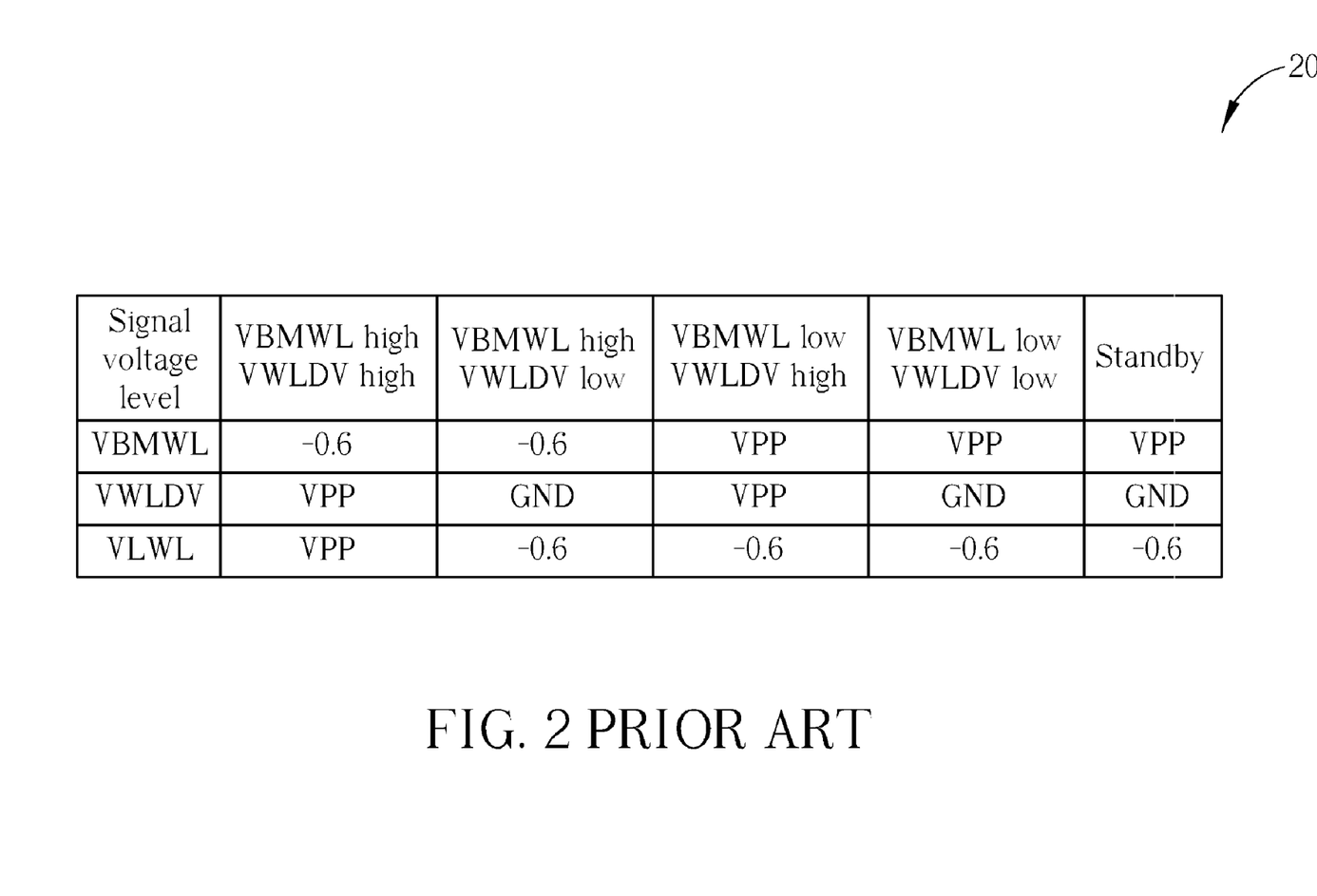
FIG. 2 illustrates a table indicating signal levels related to the local wordline driver.

The main wordline driver 100 comprises circuits for row address decoding and level shifting, where a p-type MOS transistor MP1 and an n-type MOS transistor MN1 are utilized for driving the local wordline driver 102. And, in the local wordline driver 102, a p-type MOS transistor MP2 and an n-type MOS transistor MN2 are utilized for driving the local wordline used for a memory access. In the wordline driver 10, a local wordline voltage VLWL is selected HIGH at VPP only when both a wordline driving voltage VWLDV is selected HIGH at VPP, and an inverted main wordline voltage VBMWL is output LOW at VNWL. To further demonstrate the operations of the local wordline driver 102, please refer to FIG. 2, which illustrates a table 20 indicating signal levels related to the local wordline driver 102. In FIG. 2, the last row of the table 20 indicates the output voltage level of VLWL by varying the input voltage levels of VBMWL and VWLDV, and the last column indicated the standby condition.

In the wordline driver 10, the n-type MOS transistor MN1 in the main wordline driver 100 exhibits a leakage current owing to the gate induced drain leakage (GIDL) effect. This effect is introduced by the high gate to drain and high drain to bulk voltage when the n-type MOS MN1 is in an OFF condition. Inside the n-type MOSFET MN1, where the gate voltage is lower than the drain voltage, there is a narrow depletion width located at the gate-to-drain overlap region. The strong electric field induced by the voltage drop between gate and drain makes the electrons tunnel from the valence band to conduction band and become free electrons. The free electrons generated by this effect will move to drain as leakage current. The GIDL effect is more easily observed when the drain to bulk voltage difference of the n-type MOS MN1 gets larger. Eventually, this unfavorable GIDL current is magnified by the inefficiency of the charge pump circuit and adds to the total current output from the external power source. When this happened, it is more likely the Idd6 requirement would be violated. The specification for a low power DRAM device becomes difficult to be realized.

SUMMARY OF THE INVENTION

It is therefore a primary objective of the claimed invention to provide a method to reduce the GIDL current, and eventually decrease the standby current of the DRAM device.

The present invention discloses a method for reducing leakage current of a memory device, which includes supplying a first voltage to a main wordline driver, supplying a second voltage greater than the first voltage to a local wordline driver, and employing a transistor in the local wordline driver with a threshold voltage greater than a specific value.

The present invention further discloses a device for reducing leakage current of a memory device, which includes a first voltage supply for supplying a first voltage to a main wordline driver, and a second voltage supply for supplying a second voltage greater than the first voltage to a local wordline driver. A transistor of the local wordline driver is employed with a threshold voltage greater than a specific value.

These and other objectives of the present invention will no doubt become obvious to those of ordinary skill in the art after reading the following detailed description of the preferred embodiment that is illustrated in the various figures and drawings.

DETAILED DESCRIPTION

To reduce the leakage current induced by the n-type MOS MN1 shown in FIG. 1, the present invention provides different levels of operating voltages for the main wordline driver 100 and the local wordline driver 102, because the leakage current is very sensitive to the difference between drain to bulk voltage of the n-type MOS MN1.

Figure 3:
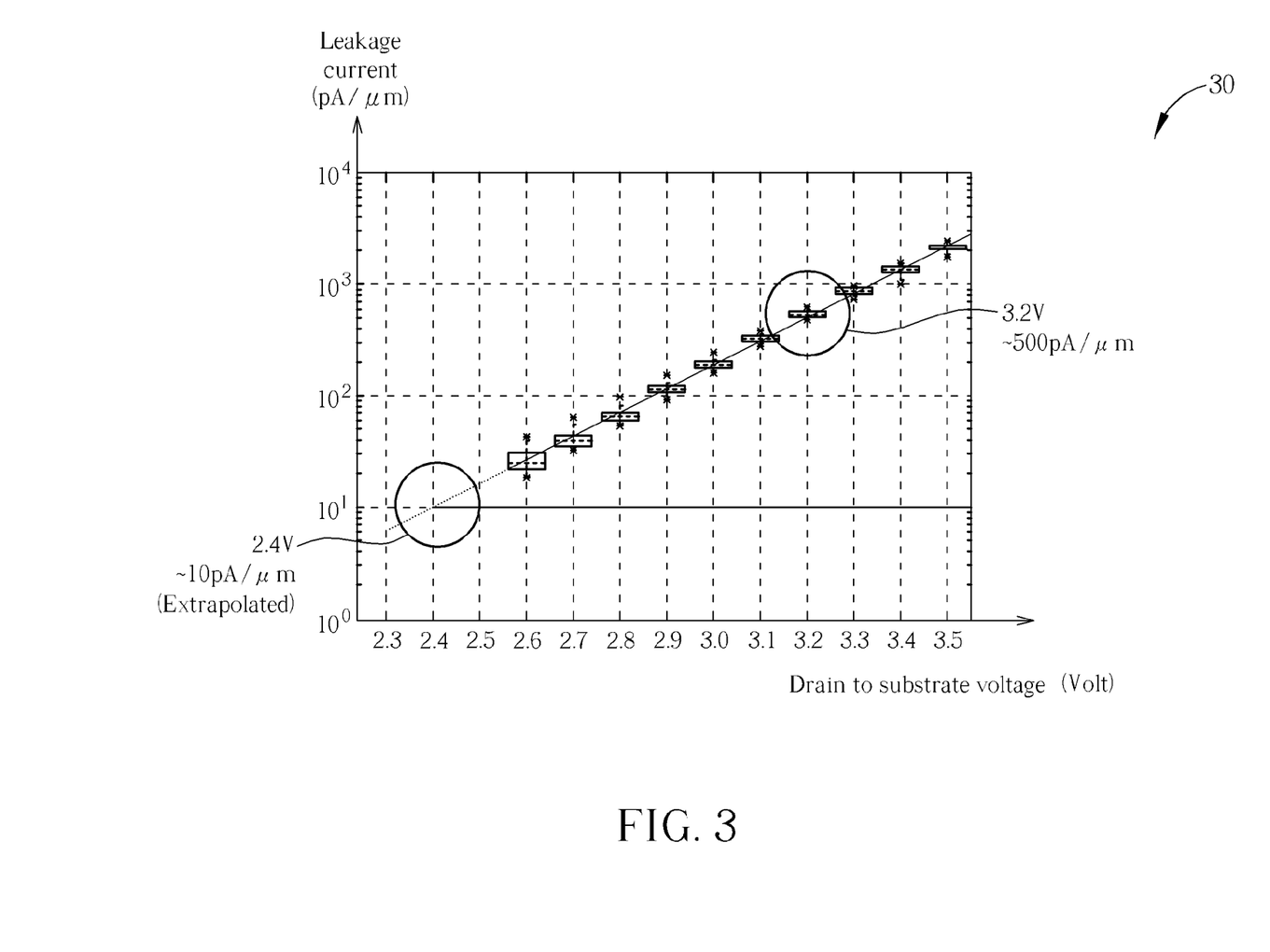
FIG. 3 illustrates a schematic diagram of the relationship between GIDL current and drain to bulk voltage.

Please refer to FIG. 3, which illustrates a schematic diagram of the relationship between GIDL current and drain to bulk voltage of the n-type MOS MN1. The GIDL current is around 500 pA/μm of device width for 3.2 volt of drain to bulk voltage in the n-type MOS transistor. As shown in FIG. 3, the GIDL current is dramatically reduced as drain to bulk voltage in the n-type MOS transistor reduces. Using such feature, the present invention can effectively reduce the leakage current.

Figure 4:
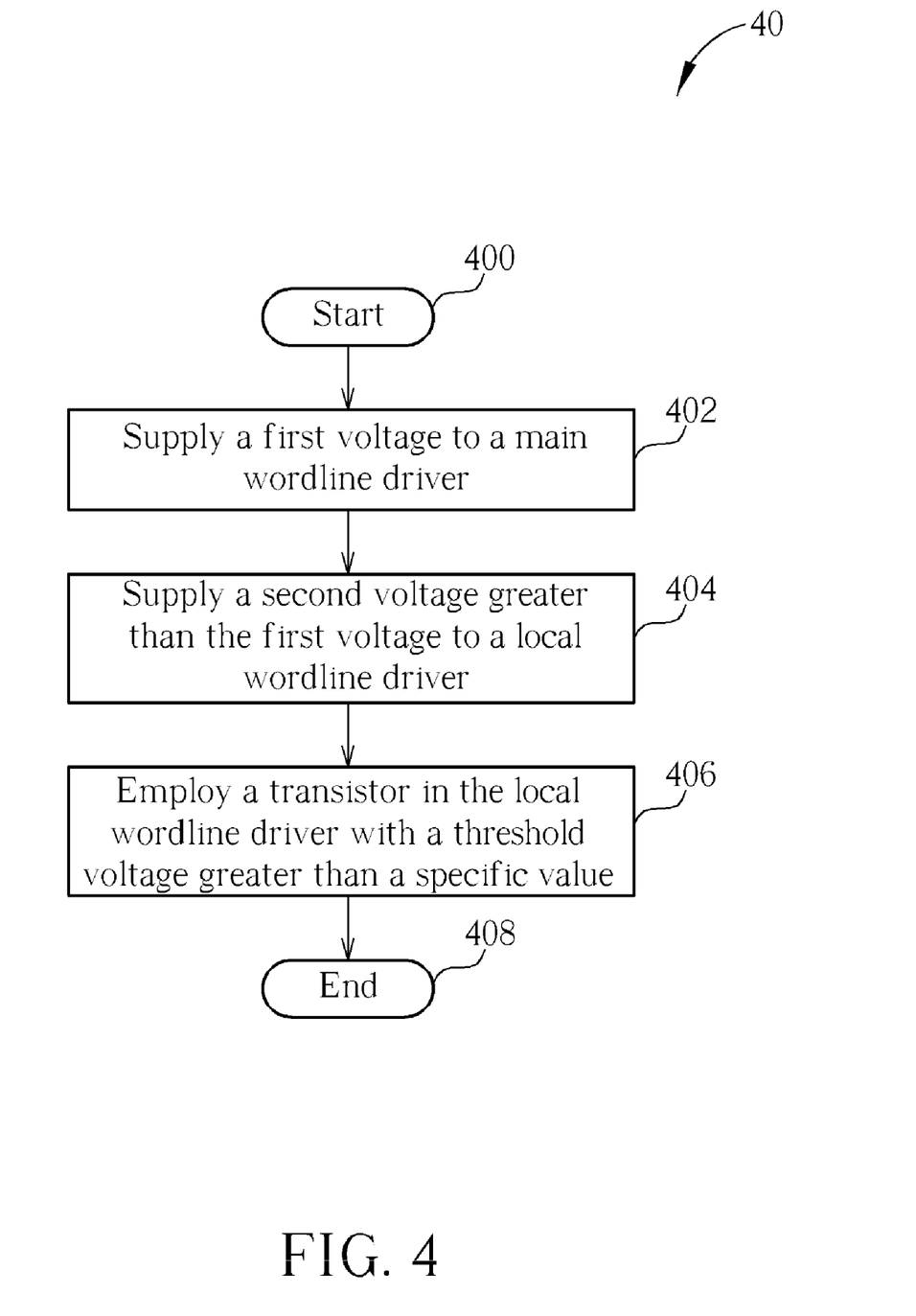
FIG. 4 illustrates a flowchart of an embodiment of the present invention.

Please refer to FIG. 4, which illustrates a flowchart 40 of an embodiment of the present invention. The flowchart 40 is utilized for reducing the leakage current induced by the GIDL effect, and comprises:

STEP 400: Start
STEP 402: Supply a first voltage to a main wordline driver.
STEP 404: Supply a second voltage greater than the first voltage to a local wordline driver.
STEP 406: Employ a transistor in the local wordline driver with a threshold voltage greater than a specific value.
STEP 408: End According to the flowchart 40, the present invention supplies different voltages to the main wordline driver and the local wordline driver, so as to reduce the leakage current induced by the GIDL effect in the main wordline driver.

Figure 5:
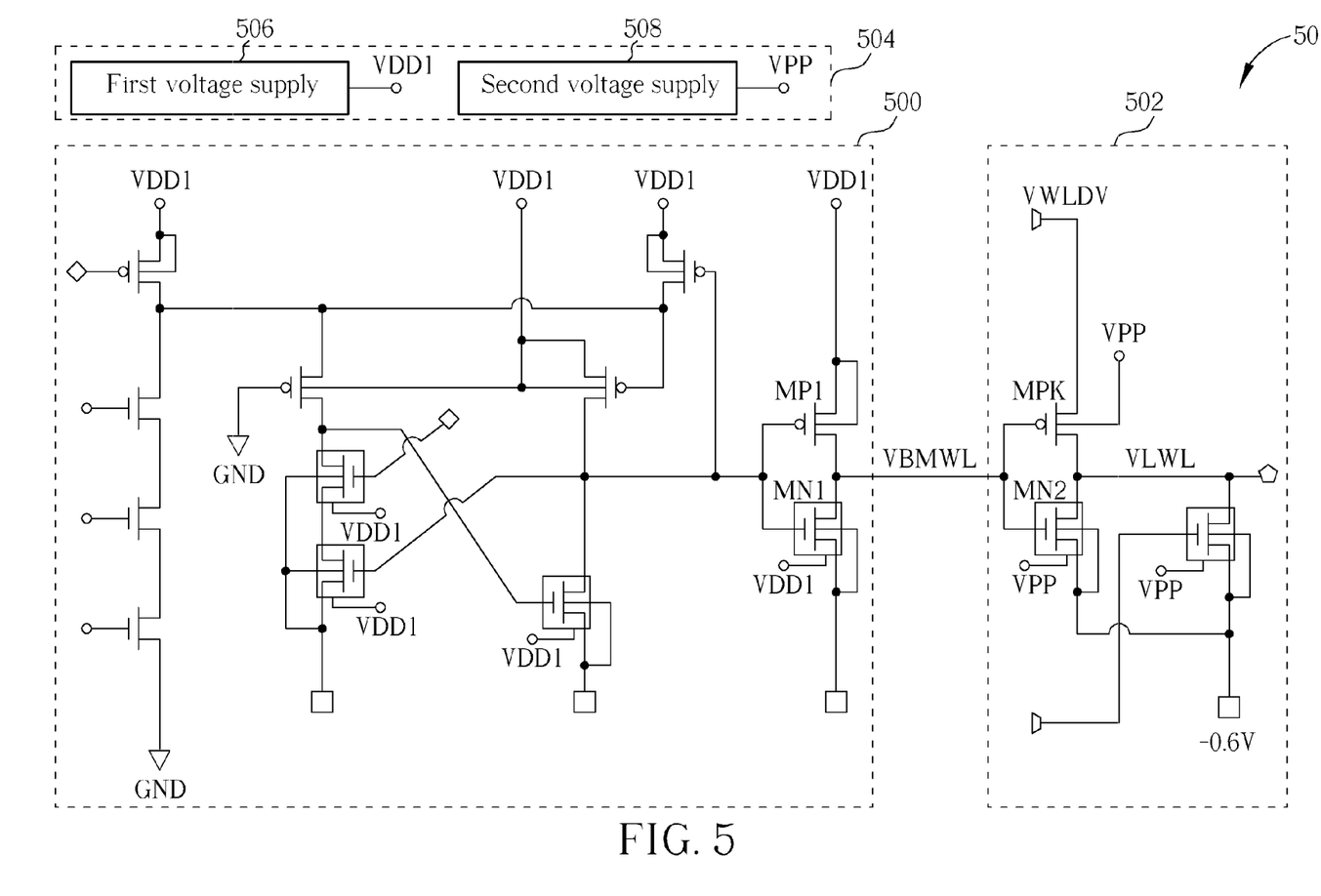
FIG. 5 illustrates a schematic diagram of a wordline driver of the present invention.

Please refer to FIG. 5, which illustrates a schematic diagram of a wordline driver 50 according to an embodiment of the present invention. The wordline driver 50 comprises a main wordline driver 500, a local wordline driver 502, and a power supply 504. The structures and operations of the main wordline driver 500 and the local wordline driver 502 are similar to those of the main wordline driver 100 and the local wordline driver 102 in FIG. 1, while a p-type MOS transistor MP2 in the local wordline circuit 502 is replaced with the p-type MOS transistor MPK in the local wordline circuit 102, and is employed with a threshold voltage greater than a specific value. The reason why the p-type MOS transistor MPK is employed with a greater threshold voltage will be narrated hereinafter. The power supply 504 comprises a first voltage supply 506 and a second voltage supply 508. The first voltage supply 506 provides a first voltage VDD1, which is complied with the JEDEC/LPDDR2 standard, to the main wordline driver 500. The second voltage supply 508 provides a second voltage VPP greater than the voltage VDD1 to the local wordline driver 502. Preferably, the second voltage supply 508 is a charge pump circuit which converts an input voltage VDD1 at 1.8 volt to the higher voltage VPP at 2.6 volt. In short, the driving voltage of the main wordline driver 500 has been changed from VPP at 2.6 volt of the prior art to a lower voltage VDD1 at 1.8 volt according to the present invention. Therefore, the drain to bulk voltage of the n-type MOS transistor MN1 can be decreased to 2.4 volt in the standby mode. According to FIG. 3, the GIDL current is around 10 pA/μm of device width for 2.4 volt of drain to bulk voltage. Compared with a GIDL current of 500 pA/μm of device width for 3.2 volt of drain to bulk voltage in the prior art, the difference is obvious.

Figure 6:
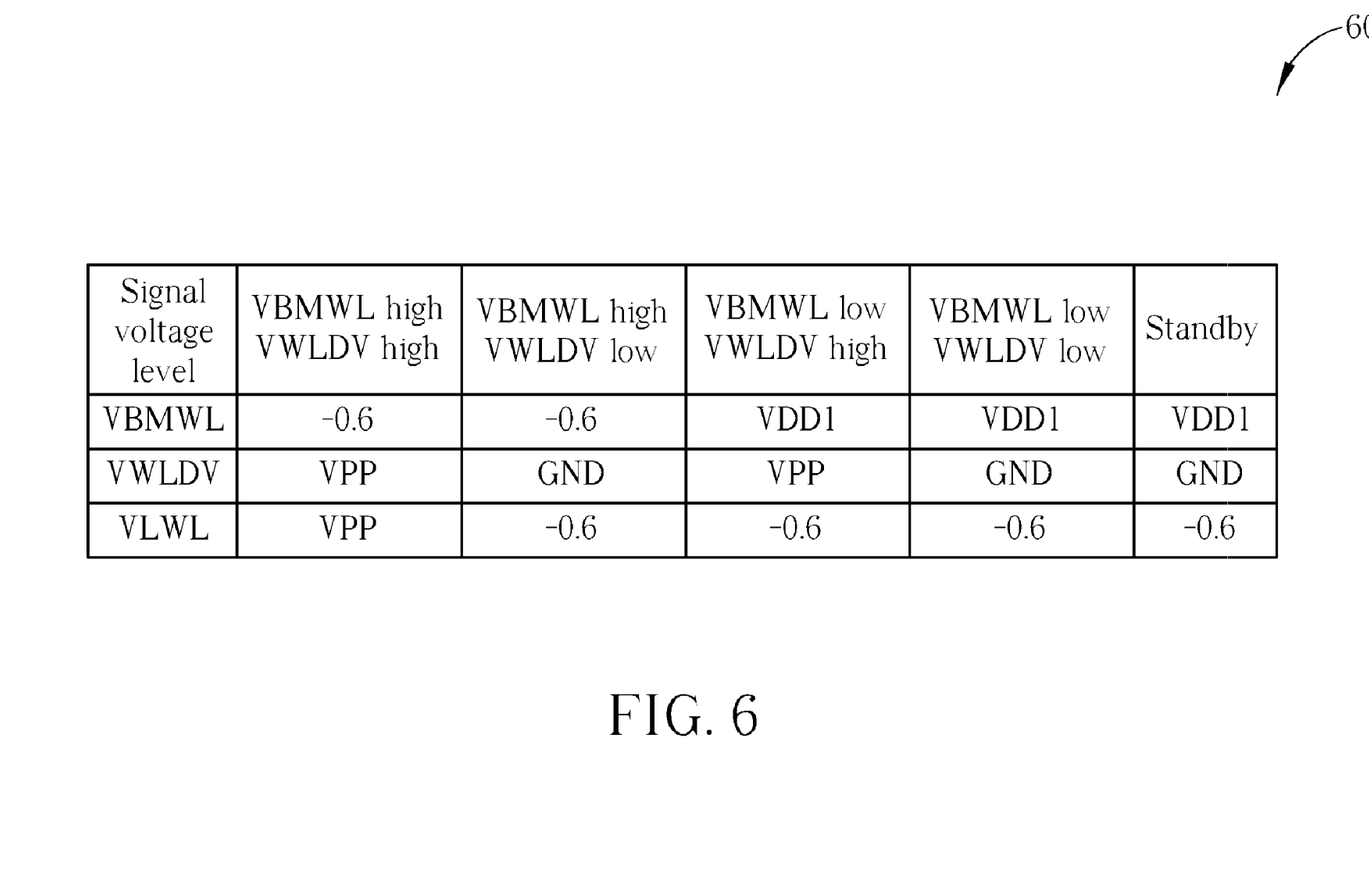
FIG. 6 illustrates a table indicating signal levels related to the local wordline circuit of the present invention.

The voltage source of the main wordline driver 500 is VDD1 at 1.8 volt, and the output of the main wordline driver VBMWL has an output HIGH at 1.8 volt, and an output LOW at VNWL at −0.6 volt. To justify the change of the operating voltage of the main wordline driver 500, the operating conditions of the local wordline driver 502 are illustrated as follows. Please refer to FIG. 6, which illustrates a table 60 indicating the signal levels related to the local wordline circuit 502. In FIG. 6, the last row of the table 60 indicates the output voltage level of VLWL by varying the input voltage levels of the inverted main wordline voltage VBMWL and the wordline driving voltage VWLDV, and the last column indicated those of a standby condition. Noticeably, the local wordline driver 502 still uses the charge pump circuit to supply voltage VPP at 2.6 volt for driving the local wordline. When the inverted main wordline voltage VBMWL is outputting HIGH at 1.8 volt, and the wordline driving voltage VWLDV is selected HIGH at 2.6 volt, the p-type MOS transistor MPK in the local wordline driver 502 can't be switched off completely. Some leakage current will flow across the transistor MPK. In order to fully switch off the p-type MOS transistor MPK of the local wordline driver 502, the threshold voltage of the p-type MOS transistor MPK is increased. According to the experiment of the present invention, it indicates that when the absolute threshold voltage is greater than 1.6 volt, the p-type transistor in the local wordline can be completely switched off given the conditions stated above. In other words, once the absolute threshold voltage of the p-type MOS transistor MPK is increased to 1.6 volt, the critical case, which VBMWL is outputting HIGH at 1.8 volt, and VWLDV is selected HIGH at 2.6 volt, the p-type MOS transistor MPK can be switched off completely, and then the operations of the local wordline driver 502 can be effectively executed.

Figure 7:
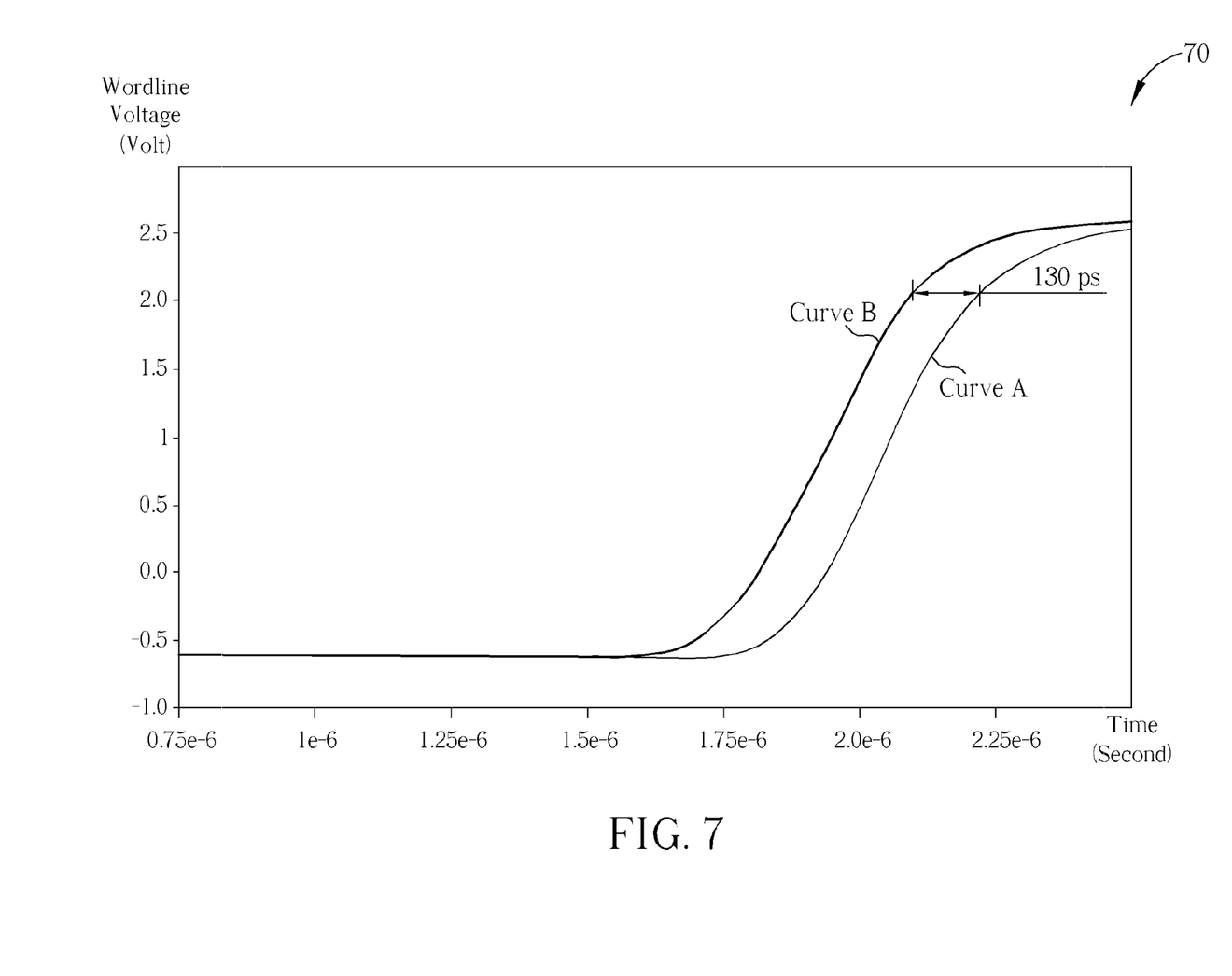
FIG. 7 illustrates a timing diagram of a local wordline.

Please refer to FIG. 7, which illustrates a timing diagram 70 of the local wordline 502. The timing diagram 70 compares the delay time of wordline driver 50 when the threshold voltage of the p-type MOS transistor MPK is 1.6 volt (Curve A), and when the threshold voltage is 0.8 volt (Curve B). A timing difference of about 130 ps (ps represents picoseconds in time) has been observed by comparing Curve A and Curve B. The delay displayed by Curve A is mainly due to the threshold voltage of the p-type MOS transistor MPK in the local wordline driver 502 is higher by 0.8 volt. The delay is considered as tolerable for many applications which the low power requirement is of primary concern.

To make a summary, the GIDL effect is unfavorable because it can introduce substantial leakage current to the memory device in the standby mode of DRAM. Because the GIDL effect is very sensitive to the drain to bulk voltage, by decreasing the operating voltage from VPP to VDD1 in the main wordline driver 500, the leakage current introduced by the GIDL effect can be decreased by about 98 percent. The absolute threshold voltage of the p-type transistor MPK in the local wordline driver 502 is increased to ensure that the transistor MPK can be fully switched off, when the inverted main wordline voltage VBMWL is output HIGH at 1.8 volt, and the wordline driving voltage VWLDV is selected HIGH at 2.6 volt.

The primary goal of the present invention is to provide a method to reduce the GIDL current, and eventually decrease the standby current of the DRAM device. A higher voltage supplied by an internal charge pump circuit has been removed from the main wordline driver, and an external voltage source of lower voltage level, which complies with LPDDR2 specifications, is applied to the n-type MOSFET MN1 of the main wordline driver 500 for reducing the leakage current induced by GIDL effect. The absolute threshold voltage of the p-type MOSFET MPK in the local wordline driver is increased to ensure proper function of the local wordline driver.

Those skilled in the art will readily observe that numerous modifications and alterations of the device and method may be made while retaining the teachings of the invention.

What is claimed is:

1. A method for reducing leakage current of a memory device functional in a standby mode and an operational mode, the method comprising:
   supplying a first voltage to a main wordline driver and a second voltage greater than the first voltage to a local wordline driver in the standby mode and the operational mode;
   and
   employing a transistor in the local wordline driver with a threshold voltage greater than a specific value.

2. The method of claim 1, wherein the first voltage is supplied by an external voltage source.

3. The method of claim 2, wherein the external voltage source is complied with a JEDEC/LPDDR2 standard.

4. The method of claim 1, wherein the second voltage is supplied by an on-chip charge pump circuit.

5. The method of claim 1, wherein the specific value is 1.6 volt.

6. The method of claim 1, wherein the transistor is a p-type metal oxide semiconductor transistor.

7. The method of claim 1, wherein the memory device is a dynamic random access memory.

8. A device for reducing leakage current of a memory device in a standby mode and an operational mode, the device comprising:
   a first voltage supply for supplying a first voltage to a main wordline driver in the standby mode and the operational mode; and
   a second voltage supply for supplying a second voltage greater than the first voltage to a local wordline driver in the standby mode and the operational mode;
   wherein a transistor of the local wordline driver is employed with a threshold voltage greater than a specific value.

9. The device of claim 8, wherein the first voltage is supplied by an external voltage source.

10. The device of claim 9, wherein the external voltage source is complied with a JEDEC/LPDDR2 standard.

11. The device of claim 8, wherein the second voltage is supplied by an on-chip charge pump circuit.

12. The device of claim 8, wherein the specific value is 1.6 volt.

13. The device of claim 8, wherein the transistor is a p-type metal oxide semiconductor transistor.

14. The device of claim 8, wherein the memory device is a dynamic random access memory.

* * * * *